United States Patent [19]

Pickard et al.

[11] 4,321,547
[45] Mar. 23, 1982

[54] ELECTRONIC DISCRIMINATION CIRCUITRY FOR THE HIGHEST FREQUENCY OF A PLURALITY OF INPUT SIGNALS

[75] Inventors: Gordon W. Pickard, Morpeth; Ian Hayward, Blyth, both of England

[73] Assignee: British Gas Corporation, London, England

[21] Appl. No.: 105,132

[22] Filed: Dec. 19, 1979

[30] Foreign Application Priority Data

Jan. 5, 1979 [GB] United Kingdom ............... 00476/79

[51] Int. Cl.$^3$ ............................................. H03K 5/26
[52] U.S. Cl. ...................................... 328/133; 328/61; 307/522; 307/528
[58] Field of Search ..................... 328/24, 55, 61, 133; 307/233 R, 522, 525, 528

[56] References Cited

U.S. PATENT DOCUMENTS

| | | | |
|---|---|---|---|
| 3,029,389 | 4/1962 | Morphet | 328/55 |
| 3,769,595 | 10/1963 | Ooya et al. | 328/133 |
| 4,015,220 | 3/1977 | Kaufman | 328/24 X |
| 4,024,458 | 5/1977 | Templin | 328/133 |

Primary Examiner—John S. Heyman
Attorney, Agent, or Firm—Watson, Cole, Grindle & Watson

[57] ABSTRACT

In electronic discrimination circuitry each of a plurality of at least three analog input signals is converted to respective digital pulse output signals and to a number of multi-phase clocking signals equal in number to the plurality of input signals are also generated such that each of the plurality of at least three analog input signals is synchronized in response to a respective one of the multi-phase clocking signals, whereby at least the leading edge of each of the digital output signals is positioned into a time slot corresponding to the multi-phase clocking signals. Selected pairs of the synchronized digital output signals are sequentially compared to determine within each compared pair that digital output signal having a higher frequency and comparing that digital output signal with another digital output signal until the digital output signal having the highest frequency is selected.

1 Claim, 1 Drawing Figure

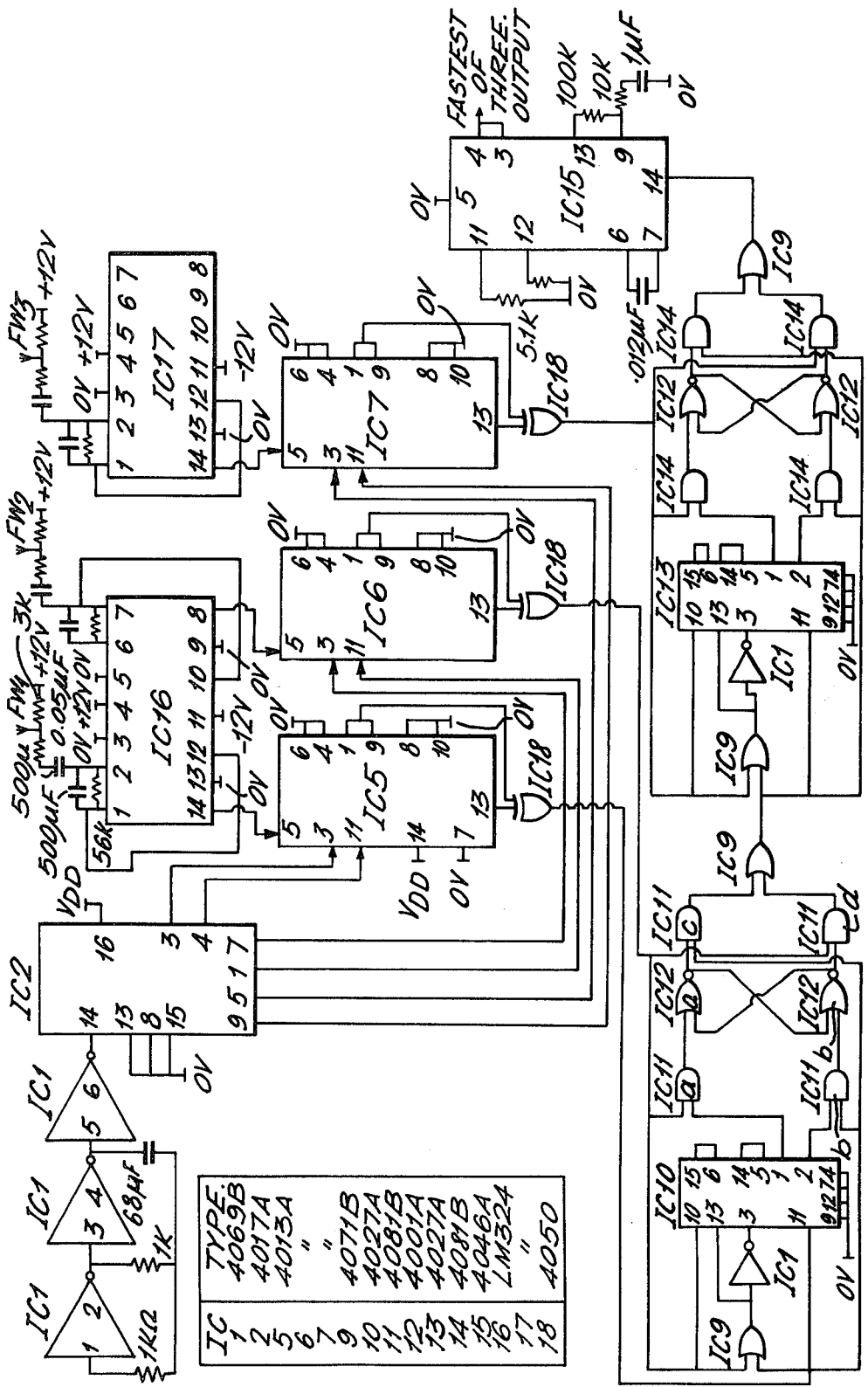

ns systmes. In particular, the invention relates to electronic discrimination circuits wherein signals are analysed which are received from at least two separate and independant velocity measuring sources.

ELECTRONIC DISCRIMINATION CIRCUITRY FOR THE HIGHEST FREQUENCY OF A PLURALITY OF INPUT SIGNALS

This invention relates to velocity measurements systmes. In particular, the invention relates to electronic discrimination circuits wherein signals are analysed which are received from at least two separate and independant velocity measuring sources.

The invention is specifically applicable to the measurement of velocity of a pipeline inspection vehicle which its velocity is determined by the measurement of signals received from a plurality of 'velocity wheels' attached to the vehicle and in contact with the pipeline surface over which the vehicle is travelling. A plurality of such wheels is conventionally used since any one or even more may not be producing accurate measurements due to sticking, skidding over the pipeline surface or even complete lift-off for the pipeline surface.

In accordance with the present invention there is provided an electronic discrimination current arrangement having a plurality of inputs for separately receiving a plurality of analogue signals, means for converting each analogue signal to a digitised pulsed-signal, a multiphase clocking system associated with a synchroniser, positioning at last the leading edge of each pulse within a time slot corresponding to clock phase, means for comparing a sequential pair of pulses to determine the pulse of highest frequency and comparing the pulse of higher frequency to the next pulse, and means for expressing the pulse of highest frequency.

The invention will be described in greater detail with reference to the accompanying drawing which is a circuit diagram for comparing and expressing the signal of highest frequency from three input signals.

The analogue inputs to the board are derived from three independent velocity wheels. Each signal is differentiated using a bandpass filter stage and then squared by a zero crossover detector. The three signals can then be processed digitally in order to isolate and transmit the highest of the three input frequencies. In this way the possibility of sampling grid and velocity measurement error due to wheel slippage is minimised.

$Ic_{16,17}$ differentiate and square the three input signals $FW_{1,2,3}$, to form digitised pulses with an equal mark-space ratio. A.C. coupled gates of $IC_1$ form a 1.5 MHz free running oscillator. This is split into a three phase clock by $IC_2$, each phase entering one of three synchronisers $Ic_{5,6,7}$.

The synchroniser positions the leading edge of a footage wheel pulse within the time slot of its respective clock phase and governs the duration of the pulse via the Exclusive-OR gate of $Ic_{18}$. The trailing edge of the FW pulse is handled in the same manner effectively doubling the frequency of the FW signal by pulsing on both positive and negative transitions.

The highest frequency of the three FW signals is determined by comparing two of the signals, the highest of these being compared with the third.

The frequency discrimination stage basically looks for consecutive pulses on any one of the two Inputs (JK) of the JK Master Slave flip-flop $Ic_{10}$. A pulse on the 'J' input clocks the flip-flop via $Ic_9$ and $Ic_1$. The trailing edge of the pulse sends Q output high enabling the gate $Ic_{11a}$. If the next pulse to occur is on the 'K' Input of $Ic_{10}$ $\overline{Q}$ goes high enabling AND gate $Ic_{11b}$. During stable frequency conditions this would repeat, unaltering the state of the latch formed by cross-coupled gates $Ic_{12a,b}$. If two consecutive pulses occur at the same input, the first pulse enables the relevant AND gate $Ic_{11,a\ or\ b}$, the second pulse is then transmitted through the gate operating the latch formed by $Ic_{12a,b}$. The output state of this latch enables either $Ic_{11c\ or\ d}$ and hence transmits the relevant input pulse train via $Ic_{9b}$. The same procedure is followed in the second discriminator stage the output being fed to the phase lock loop $Ic_{15}$. The loop smoothes out the phase discontinuities present on switch over from one wheel to another. The output signal is twice the frequency of the input with a one to one mark-space ratio.

We claim:
1. Electronic discrimination circuitry, comprising:
   means for converting each of a plurality of at least three analog input signals to respective digital pulse output signals;
   multi-phase clocking means for generating a number of multi-phase clocking signals equal in number to the plurality of input signals;
   means for synchronizing each of said plurality of at least three analog input signals in response to a respective one of said multi-phase clocking signals for positioning at least the leading edge of each of said digital output signals into a time slot corresponding to said multi-phase clocking signals;
   means for sequentially comparing selected pairs of said synchronized digital output signals to determine within each compared pair thereof that digital output signal having a higher frequency and comparing that digital output signal with another digital output signal until the digital output signal having the highest frequency is selected; and
   means for outputting the synchronized digital output signal of highest frequency.

* * * * *